(12) United States Patent
Dunlap et al.

(10) Patent No.: US 6,373,268 B1
(45) Date of Patent: Apr. 16, 2002

(54) TEST HANDLING METHOD AND EQUIPMENT FOR CONJOINED INTEGRATED CIRCUIT DICE

(75) Inventors: Stewart O. Dunlap; Stephen E. Bastear, both of Folsom; Gary M. Meszaros, Roseville; Nasser M. Barabi, Lafayette; James E. Spooner, Manteca, all of CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/309,195

(22) Filed: May 10, 1999

(51) Int. Cl.⁷ ............................................. G01R 31/02
(52) U.S. Cl. ...................... 324/755; 324/765; 324/754; 324/758
(58) Field of Search ................................ 324/765, 755, 324/758, 754, 761

(56) References Cited

U.S. PATENT DOCUMENTS

| | | | |
|---|---|---|---|
| 3,809,050 A | | 5/1974 | Chough et al. |
| 4,066,249 A | | 1/1978 | Huber et al. |
| 4,209,745 A | | 6/1980 | Hines |
| 4,443,756 A | | 4/1984 | Lightbody et al. |
| 4,510,445 A | | 4/1985 | Kvaternik |
| 4,602,417 A | | 7/1986 | Mesch et al. |
| 4,640,501 A | | 2/1987 | Poland |
| 4,786,867 A | * | 11/1988 | Yamatsu ..................... 324/758 |
| 4,881,711 A | | 11/1989 | Vollaro |
| 4,929,893 A | * | 5/1990 | Sato et al. .................. 324/758 |
| 4,934,064 A | * | 6/1990 | Yamaguchi et al. .......... 33/645 |
| 4,956,605 A | * | 9/1990 | Bickford et al. ............ 324/760 |
| 4,985,676 A | | 1/1991 | Karasawa |
| 5,136,827 A | * | 8/1992 | Sawaya ........................ 53/453 |
| 5,153,708 A | * | 10/1992 | Ohikata et al. ................ 357/70 |
| 5,172,053 A | * | 12/1992 | Itoyama ....................... 324/758 |
| 5,303,938 A | | 4/1994 | Miller et al. |
| 5,410,259 A | * | 4/1995 | Fujihara et al. ............. 324/758 |
| 5,439,205 A | | 8/1995 | Haberle |
| 5,453,699 A | * | 9/1995 | Makishita et al. .......... 324/754 |
| 5,570,033 A | | 10/1996 | Staab |
| 5,637,916 A | | 6/1997 | Joshi |
| 5,667,128 A | | 9/1997 | Rohde et al. |
| 5,677,566 A | | 10/1997 | King et al. |
| 5,684,330 A | | 11/1997 | Lee |
| 5,714,800 A | | 2/1998 | Thompson |
| 5,744,974 A | | 4/1998 | Bogden |
| 5,756,370 A | | 5/1998 | Farnworth et al. |
| 5,769,237 A | | 6/1998 | Althouse et al. |
| 5,795,172 A | | 8/1998 | Shahriari et al. |
| 5,814,894 A | | 9/1998 | Igarashi et al. |
| 5,815,000 A | | 9/1998 | Farnworth et al. |
| 5,834,945 A | | 11/1998 | Akram et al. |
| 5,844,419 A | | 12/1998 | Akram et al. |
| 5,854,507 A | | 12/1998 | Miremadi et al. |
| 5,866,949 A | | 2/1999 | Schueller |
| 5,892,273 A | | 4/1999 | Iwasaki et al. |
| 5,892,288 A | | 4/1999 | Muraki et al. |
| 6,005,401 A | * | 12/1999 | Nakata et al. .............. 324/754 |

OTHER PUBLICATIONS

Kessler, Jack, Chip–Scale Packaging Final Test: The Paradigm Shift Begins, *Chip Scale Review*, May 1998, vol. 2, No. 2, pp. 26–30.

Electroglas, Inc., Automatic Wafer Prober System Model 2001X, *Xynetics* (1998).

* cited by examiner

Primary Examiner—Safet Metjahic
Assistant Examiner—T. R. Sundaram
(74) Attorney, Agent, or Firm—Blakely, Sokoloff, Taylor & Zafman LLP (57) ABSTRACT

A test handling assembly for conjoined integrated circuit dies is disclosed. The assembly has a wafer prober system having a chuck. A panel stage is coupled to the chuck and conjoined integrated circuit dies are coupled to the panel stage. A contactor is provided to communicate with the conjoined integrated circuit dies and the wafer prober system. Other features are disclosed.

30 Claims, 11 Drawing Sheets

LAYERS DESIGNATIONS
- LAYER (1) COMPSIDE
- LAYER (2) GNDPLANE
- LAYER (3) INNER "A" (50-OHM)
- LAYER (4) V1 (VCC)
- LAYER (5) INNER "B" (50-OHM)
- LAYER (6) V2 (VCCO)
- LAYER (7) INNER "C" (50-OHM)
- LAYER (8) V3 (VPP)
- LAYER (9) INNER "D" (50-OHM)
- LAYER (10) SOLDSIDE

TEST HANDLING METHOD AND EQUIPMENT FOR CONJOINED INTEGRATED CIRCUIT DICE

BACKGROUND OF THE INVENTION

1. Field of the Invention

The present invention relates to test handling methods and equipment for conjoined integrated circuit dies.

2. Background Information

A plastic, integrated circuit housing is conventionally injection molded about an integrated circuit chip mounted to a substrate to form an integrated circuit package that may measure 1 ½ inches by 1 ½ inches. A trend in the integrated circuit packaging industry has been to scale the integrated circuit package to the size of the chip or "die" contained therewithin by eliminating the need to encapsulate the chip within a plastic housing on a substrate. This is accomplished by attaching interposers of ceramic, organic laminates, or, preferably, flexible polyamide films to the exposed circuit pattern on the bottom of a flip chip. The resulting product, known as a Chip Scale Package when singulated, minimizes package parasitics and permits shorter, finer trace lines while eliminating the flip chip need of an underfill step after assembly. U.S. Pat. Nos. 5,684,330, 5,714,800, and 5,814,894 relate to different Chip Scale Packages.

Figures 1, 2A:
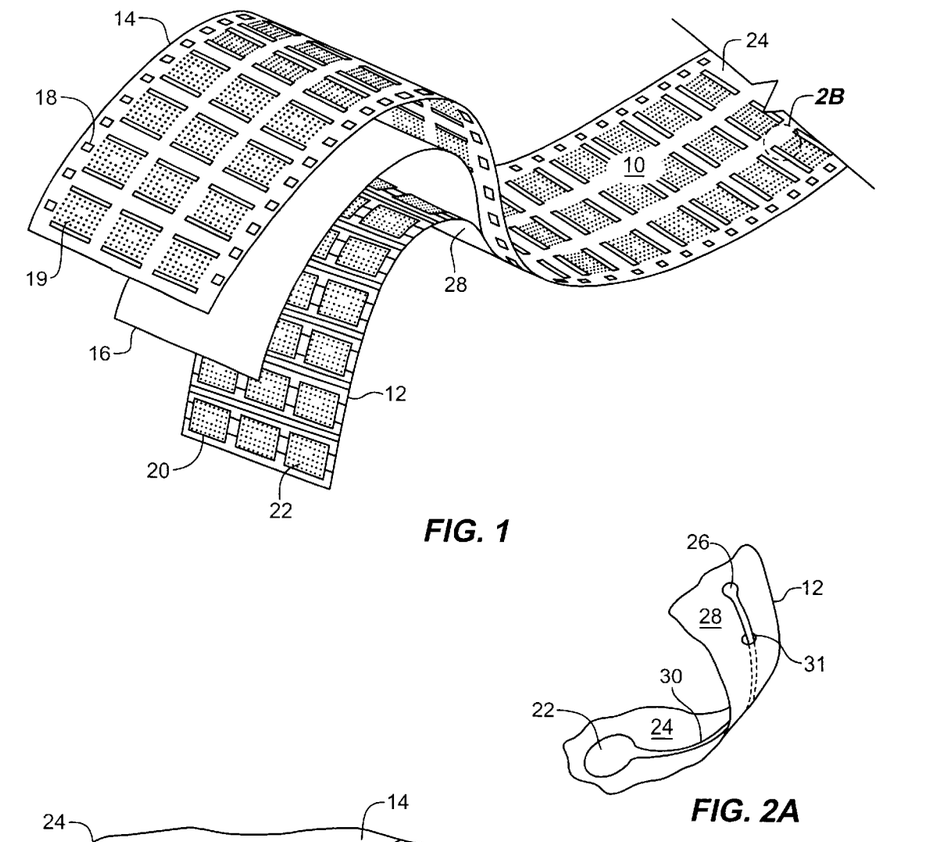
FIG. 1 is an isometric view of a long, three-layer (one-metal layer) flexible interposer tape.

The flexible, polyamide film used to produce a Chip Scale Package (CSP) such as a Microball Grid Array ($\mu$BGA) may be a long, three-layer (one-metal layer) flexible interposer tape 10 as shown in FIG. 1. The three layers of tape 10 consist of rolled copper layer 12 laminated to polymer film 14 with a layer of adhesive 16. Following lamination, adhesive 16 is cured. Flexible interposer tape 10 has sprocket holes 18 and matrix holes 19 distributed along the length of tape 10. Sprocket holes 18 receive toothlike projections arranged on a wheel rim to urge tape 10 forward during handling. Matrix holes 19 are discussed below.

Figure 2B:
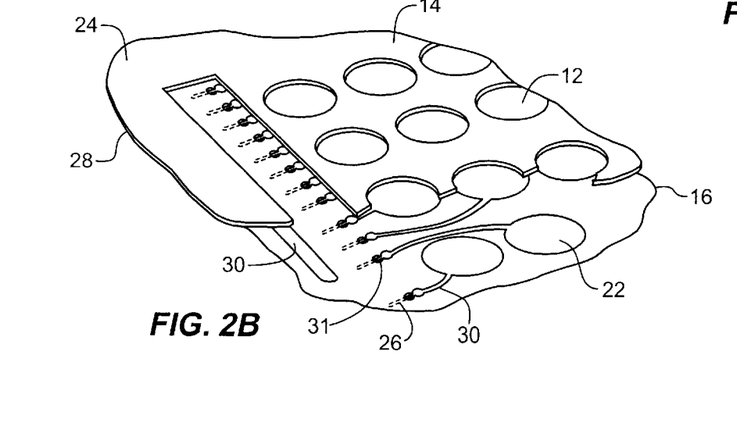
FIG. 2 shows a lead pattern matrix etched to form land pads and lead beams coupled between traces and through holes.
Figure 3:
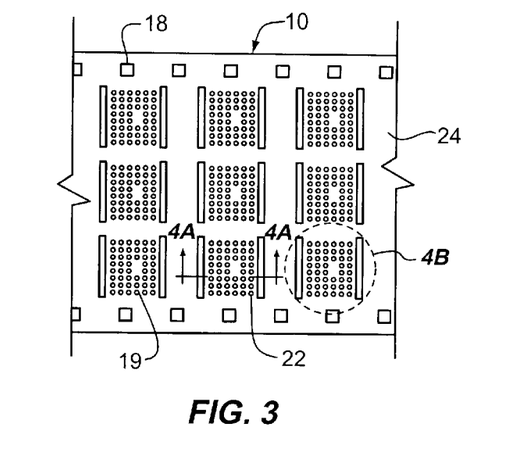
FIG. 3 shows plated land pads exposed for access through matrix holes.
Figure 4A:
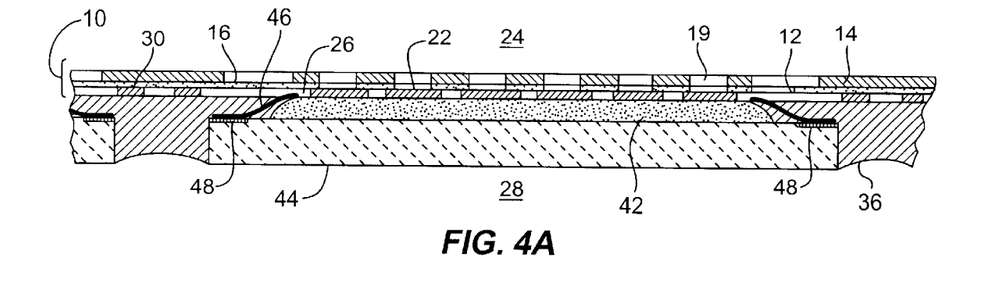
FIG. 4 shows a die electrically and mechanically coupled to the interposer tape.
Figure 4B:
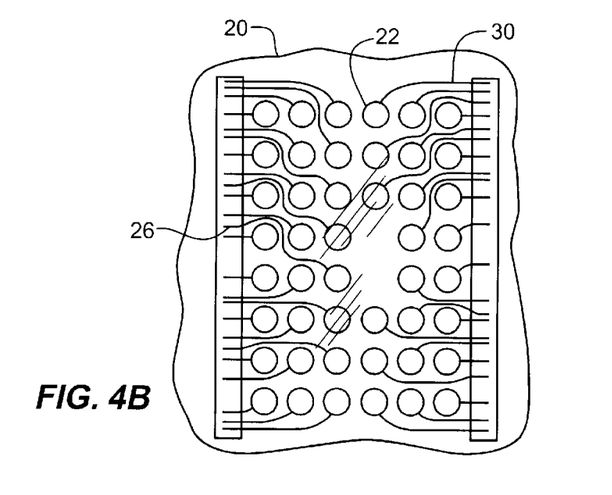

A plurality of uniformly spaced device sites or lead patterns 20 are photolithographically defined on copper layer 12 into a matrix having a particular pitch to allow for efficient material handling. As illustrated by example in FIG. 2, the lead pattern 20 matrix is etched to form land pads 22 on circuit side 24 that are complimentary to matrix holes 19 of FIG. 1. Land pads 22 permit the deposition of bumps by solder ball placement ultimately to populate die 44 (FIG. 4) with solder balls to form a complete CSP. The lead pattern 20 matrix also is connected to lead beams 26 on chip side 28 through a combination of traces 30 and through holes 31 that run through the thickness of copper layer 12. Subsequently, land pads 22, traces 30, through holes 31, and lead beams 26 are plated with a thin layer of gold or electroless tin. FIG. 3 shows plated land pads 22 as exposed for access at circuit side 24 through matrix holes 19 of interposer tape 10.

To mass produce CSPs, a low viscosity, low stress adhesive 42 of FIG. 4 is dispensed onto chip side 28 of interposer tape 10. Adhesive 42 aids in coupling chip 44 to interposer tape 10. Arranged around the perimeter of each chip 44 is In Puts/Out Puts (I/Os) 48. Each chip 44 is picked and placed about lead beams 26 of one lead pattern 20. Bonding wires 46 are arranged between gold plated, copper lead beams 26 and In Puts/Out Puts (I/Os) 48 of the associated individual chip 44 and bonded thereto through sonic waves as shown in FIG. 4. The sonic wave bonding process electrically interconnects each chip 44 to the flexible interposer tape 10 as well as mechanically interconnects each chip 44 to the flexible interposer tape 10 by curing the low stress adhesive 42. Chip side 28 of interposer tape 10 is then coated with encapsulant 36 to seal the remaining exposed metal trances 30 on chip side 28 and to provide a die edge bumper to prevent the die from cracking during handling.

Figure 5:
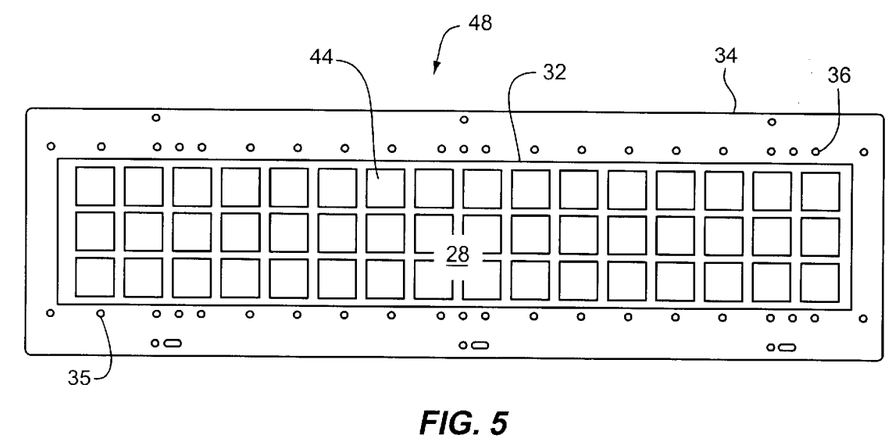
FIG. 5 shows the chip side of the reinforcing panel.

The long length of flexible interposer tape 10 having a matrix of interconnected dies is then segmented into strips or panels 32. FIG. 5 shows a three row, sixteen column matrix. Segmented panel 32 may then be mounted on aluminum carrier frame 34 using a heat sensitive tape such as tape 38 shown in FIG. 6. Aluminum carrier frame 34 permits standard magazine-to-magazine handling as well as permits alignment such as by alignment holes 35 and 36. Segmented panel 32 mounted to carrier frame 34 with tape 38 forms reinforced panel 48 as shown with chip side 28 facing up in FIG. 5 and with circuit side 24 facing up in FIG. 6. An example of a reinforced panel is shown in U.S. Pat. No. 5,866,949.

To conventionally test the CSP's, the dies are populated with solder balls and cut from the segmented panel in a process known as singulation such as in U.S. Pat. No. 5,756,370, U.S. Pat. No. 5,815,000, U.S. Pat. No. 5,834,945, and U.S. Pat. No. 5,844,419. The singulated CSP's are then tested individually, which wastes time. A more efficient technique would be to test dies 44 while mounted on reinforcing panel 48.

CSP test handling equipment is dependent on package thickness, outer dimension, pitch, pad flatness, and pad height. Thus, a critical concern in multi-unit testing of two or more dies such as might be conjoined within reinforcing panel 48 is the alignment relationship between each individual die within segmented panel 32. Moreover, because CSPs are die size, they will continue to change size both in outside dimensions and thickness. Thus, CSP test handling equipment must be flexible enough to change with the change in die size. In addition, without the protection of solder ball bumps, the land pads of each die are more sensitive to the force used to contact a prober to a pad surface. Also, since cost is usually a factor, it is important to be able to utilize existing wafer prober systems in handling and testing conjoined dies. Some of these needs are identified in Jack Kessler, *Chip-Scale Packaging Final Test; The Paradigm Shift Begins,* 2 Chip Scale Review 26 (May 1998), but remain unsatisfied.

What is need is test handling method and equipment for conjoined integrated circuit dies that utilize existing wafer prober systems and are sensitive enough to account for the alignment relationship between each individual die and to account for the exposed pad surface as well as flexible enough to change with the change in die size.

SUMMARY OF THE INVENTION

A test handling assembly for conjoined integrated circuit dies is disclosed. The assembly has a wafer prober system having a chuck. A panel stage is coupled to the chuck and conjoined integrated circuit dies are coupled to the panel stage. A contactor is provided to communicate with the conjoined integrated circuit dies and the wafer prober system. Other features are disclosed.

DETAILED DESCRIPTION OF THE INVENTION

Figure 7:
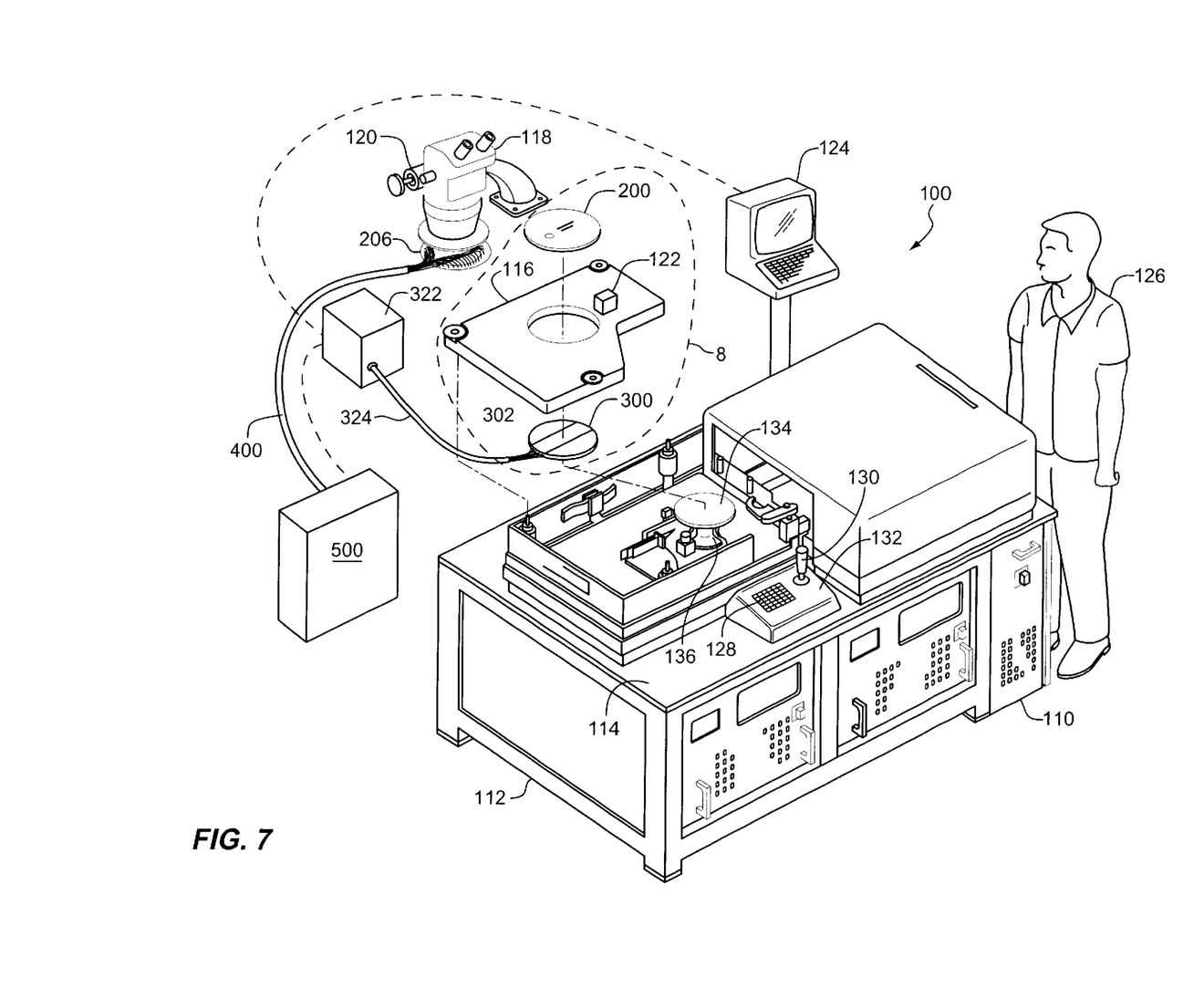
FIG. 7 is a first isometric view of a test handling apparatus for conjoined integrated circuit dies.
Figure 8:
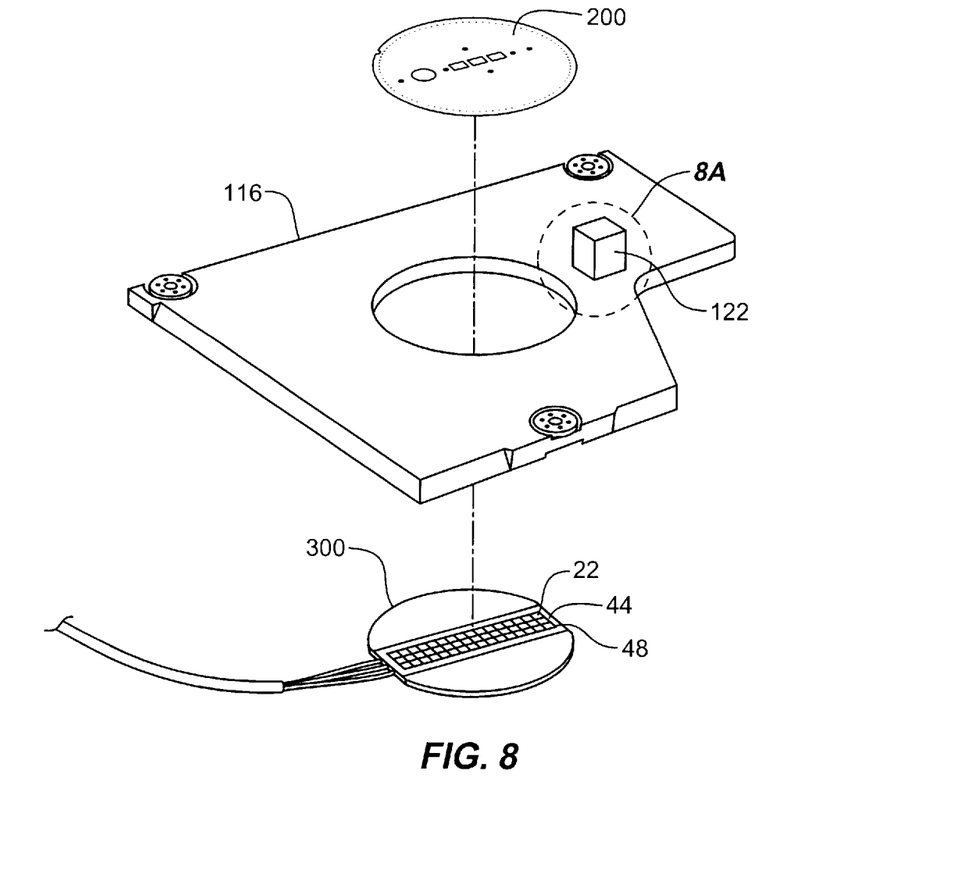
FIG. 8 is a second isometric view of a test handling apparatus for conjoined integrated circuit dies.
Figure 8A:
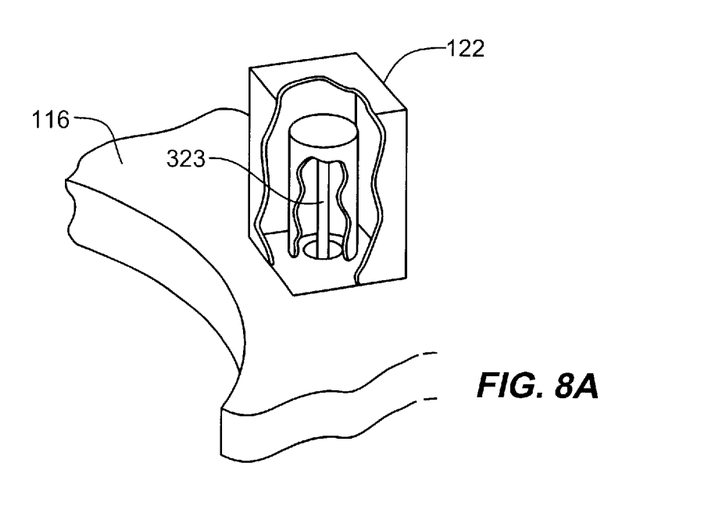

Referring to the drawings more particularly by reference numbers, FIG. 7 is a first isometric view of test handling apparatus 100 for conjoined integrated circuit dies. FIG. 8 is a second isometric view of test handling apparatus 100 for conjoined integrated circuit dies. Test handling apparatus 100 may include wafer prober system 110 into which prober card 200 is secured so as to be able to probe dies 44 within reinforced panel 48 (FIG. 5) as mounted on panel stage 300 of FIG. 8. On engaging land pads 22 of dies 44 with probing pins 201 coupled to prober card 200, prober card 200 sends signals between each die 44 and tester 500 through cabling 400.

Wafer prober system 110 shown in FIG. 7 preferably is an existing wafer prober system such as Automatic Wafer Prober System Model 2001X manufactured by Electroglas, Inc., of Santa Clara, Calif. The system overview and automatic alignment process for Electroglas Automatic Wafer Prober System Model 2001X was submitted under an Information Disclosure Statement for this patent and is incorporated into this patent by reference. Cabinet 112 serves both as a storage device for the controllers, disk drives, and printers and as a stable pedestal for the hardware of prober system 110. Residing at a fixed reference distance from the top surface 114 of prober system 110 is ring carrier 116. Ring carrier 116 serves as a mount for at least three items: microscope 118 (having video camera 120 therewithin), air leveler 122 for profiling as level, stage surface 302 of panel stage 300, and prober card 200 for probing the integrity of the electrical paths within die 44. The feed from video camera 120 is directed to monitor 124, where the images appearing on monitor 124 assist operator 126 in operating keys 128 and joystick 130 of control console 132.

Figure 6:
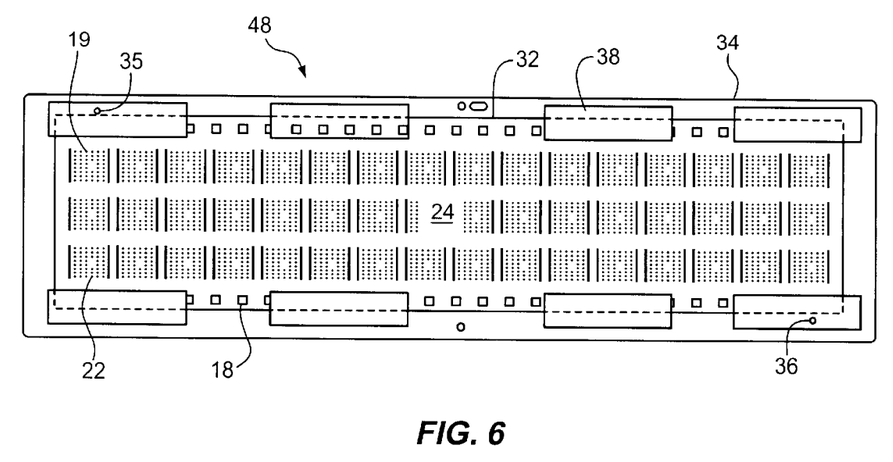
FIG. 6 shows the circuit side of the reinforcing panel.
Figure 14:
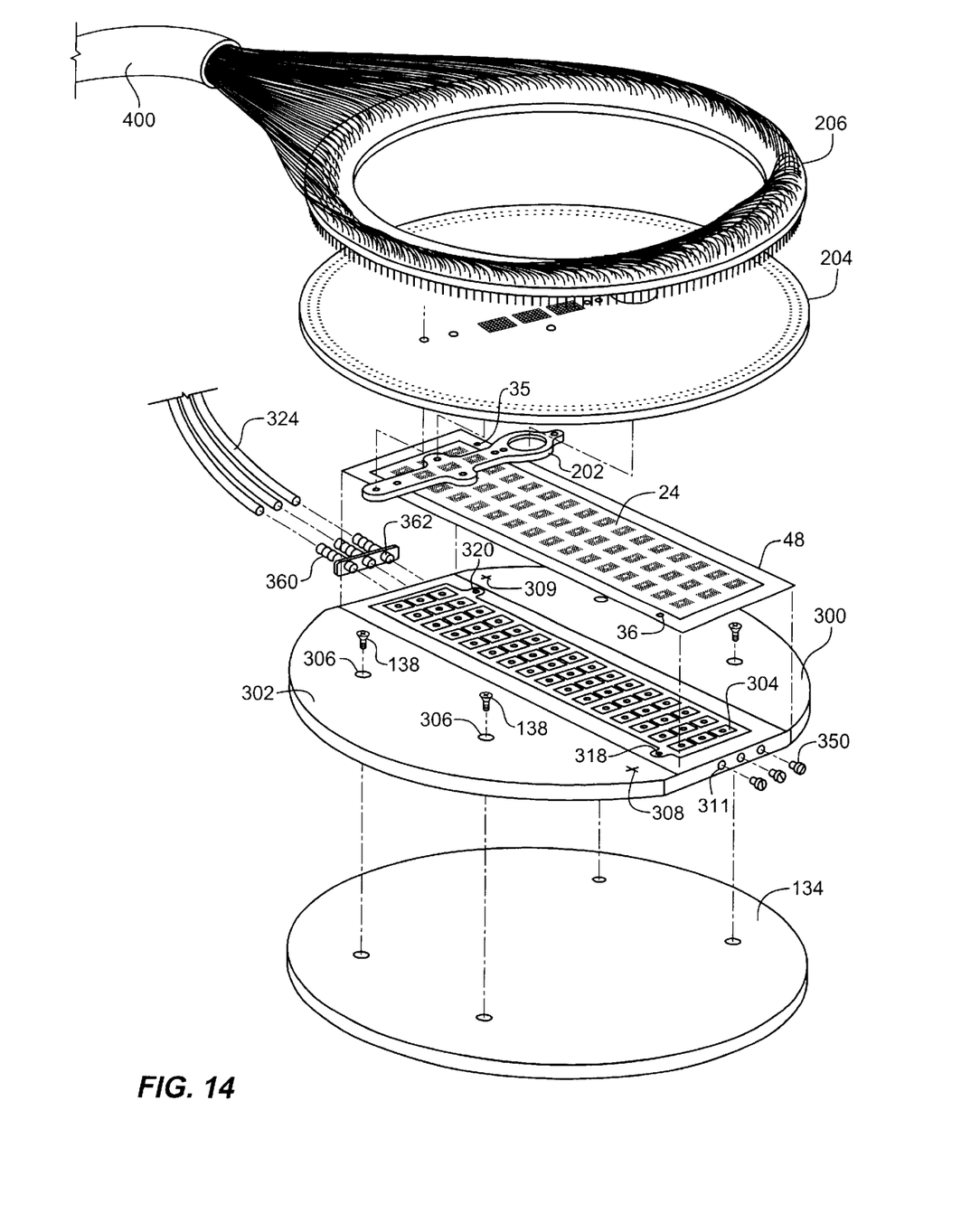
FIG. 14 is an exploded view of an assembly of an invention embodiment.

Conjoined integrated circuit dies may be thought of as two or more dies maintained a distance apart. This may be by a rigid, fixed spacer, a semi-rigid spacer such as interposer tape 10 as shown in FIGS. 5 and 6, other techniques. To repeatedly test two or more conjoined dies, the alignment between land pads 22 as seen in FIG. 3 and fixed pin groups 201 on prober card 200 must be established and known to an accurate degree of tolerance with respect to a fixed reference. This alignment relationship may involve adjustments in the X, Y, Z, pitch and roll directions of either the dies, the prober card, or a combination thereof. Since land pads 22 are exposed on dies 44, preferably, dies 44 are adjusted by fixing dies 44 to chuck 134 and then adjusting chuck 134 in relationship to top surface 114 of prober system 110. Chuck 134 may be a conventional wafer chuck such as a circular disk onto which panel stage 300 may be securely mounted through four screws 138 (FIG. 14).

To provide movement of chuck 134 in the X, Y, Z, pitch and roll directions in relationship to top surface 114 of prober system 110, motor 136 is mounted in relation to top surface 114. Operator 126 of FIG. 8 engages keys 128 and joystick 130 of control console 132 to manipulate the movement of motor 136 and, in turn, chuck 134. Chuck 134, in turn, imparts the necessary adjustment to land pads 22 on dies 44 in relationship to fixed pin groups 201 on prober card 200.

Figure 9:
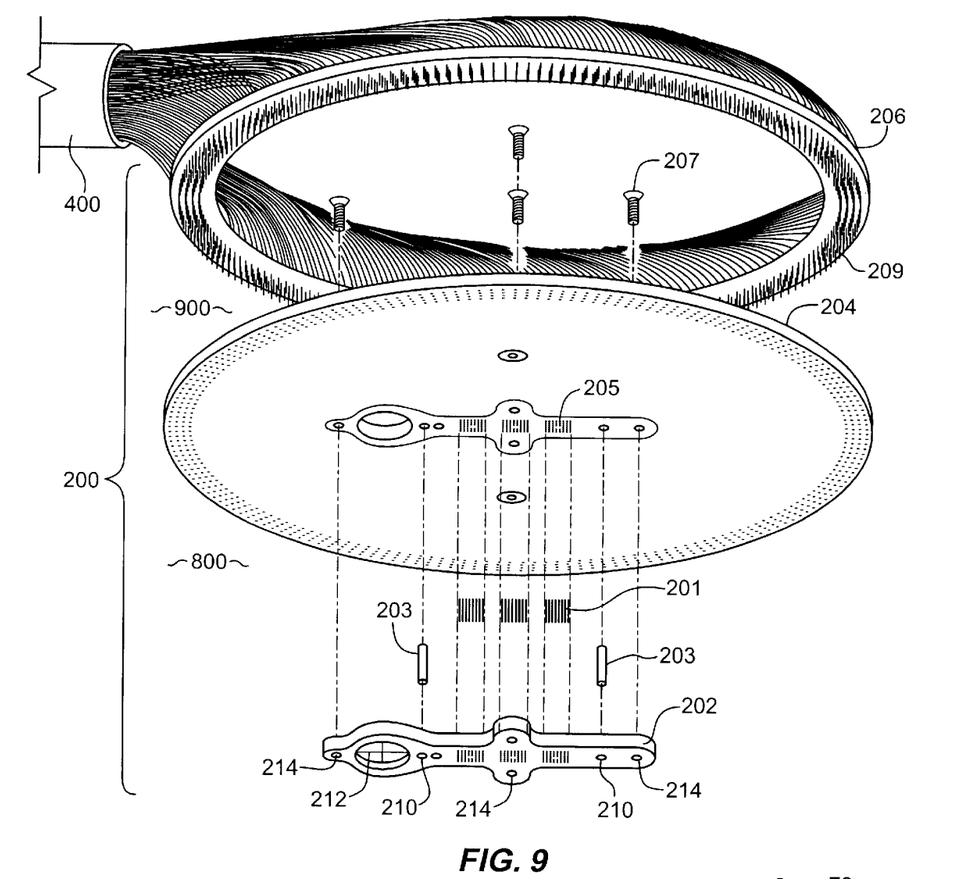
FIG. 9 shows an exploded view of a probe card with fixed pin groups disposed between a contactor and an interface board.

FIG. 9 shows an exploded view of probe card 200 with fixed pin groups 201 disposed between contactor 202 and interface board 204. Probe card 200 may comprise fixed pin groups 201, contactor 202, dowel pins 203, interface board 204 and cabling ring 206.

Figure 10:
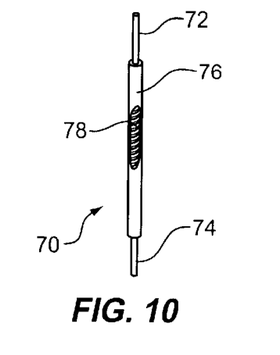
FIG. 10 is a detail view of a pogo pin.

Fixed pin groups 201 serve as an electrical bus between land pads 22 of dies 44 and electrical pads 205 of interface board 204. Conventionally, pogo pins are used in testing dies, one for each electrical interface on the die. FIG. 10 is a detail view of pogo pin 70. Each pogo pin 70 comprise two probing pins, pin 72 and pin 74, between which spring 78 is arranged into hollow tube 76. Pin 72 and pin 74 are permitted to move axially with respect to hollow tube 76, but are prevented from leaving hollow tube 76 by a lip formed into each end of hollow tube 76. Spring 78 imparts an outward force in which pins 72 and 74 typically overcome when coming in contact with an electrical land pad. Conventionally, test handling devices require springs having at least a spring force of 40 ounces to make good electrical contact. This is sufficient for making contact with the balls of a ball grid array, but would damage exposed land pads were 40 ounce spring pogo pins used for such a purpose. Due to the alignment technique of the invention, however, the test handling device of the present invention requires only springs having 10 ounces. This reduces the time it takes to make good electrical contact and minimizes the possibility of penetrating contact pads.

Contactor 202 of FIG. 9 is coupled to testing side 800 of interface board 204 through dowel pins 203 and screws 207. Contactor 202 serves to engage land pads 22 of dies 44 (FIG. 6). Dowel pins 203 may be round pin that fits tightly into a corresponding holes between contactor 202 and interface board 204 so as to align and fasten these two adjacent pieces. Interface board 204 (or load board 204) comprises buses of power and ground to provide power and other electrical services to contactor 202 as well as reconfigures the grid shaped input of contactor 202 into ringed shaped output. Cabling ring 206 is attached to communication side 900 of interface board 204 through pins 209 to both receive electrical information from the ringed shaped output of interface board 204 and transmit this information to tester 500 through cabling 400 (FIG. 8).

Figure 11:
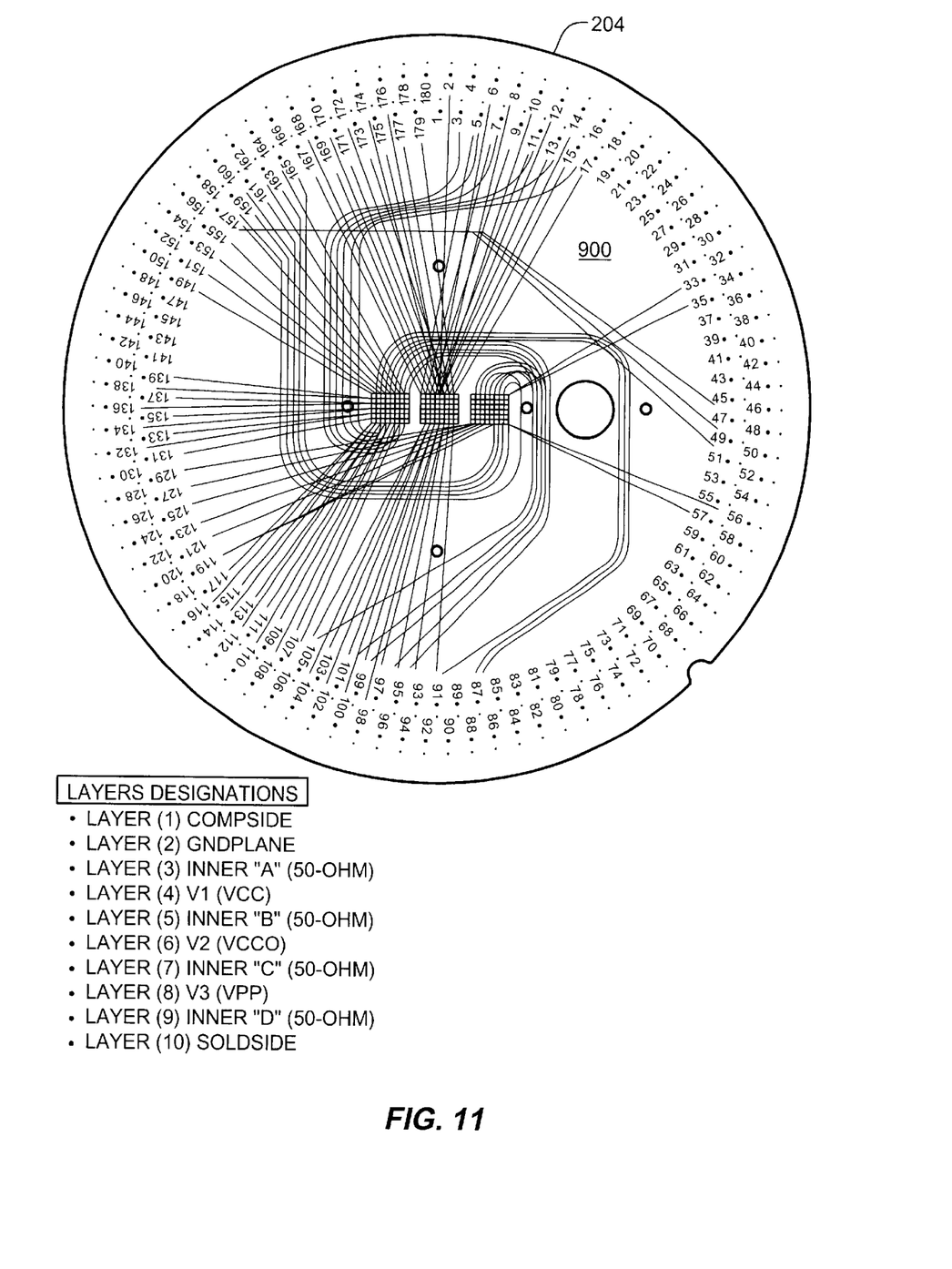
FIG. 11 illustrates a probe ring wiring pattern for the communication side of the probe card.

FIG. 11 illustrates a probe ring wiring pattern for communication side 900 of interface board 204. With three lead patterns 20 each having forty-six land pads 22, at least 138 buses are need. Accounting for power and ground on different plane layers, interface board 204 preferably provides 180 buses. As indicated in FIG. 11, interface board 204 may be a ten lay composite that redistributes the tight pitched matrix of lead pattern 20 into a wider distribution. In this case, a circular distribution was selected to be compatible with the Electroglas Automatic Wafer Prober System Model 2001X.

Figure 12A:
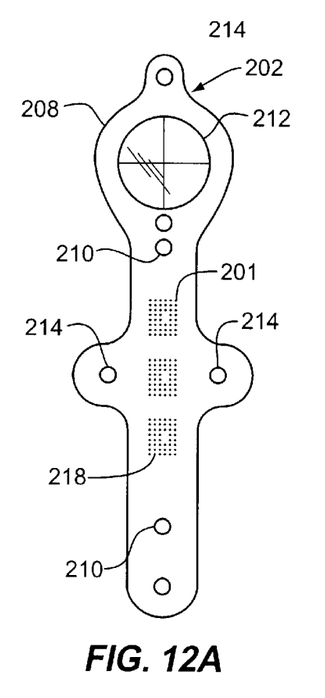
FIG. 12A illustrates the testing side of the contactor with pogo pins.

FIG. 12A illustrates testing side 800 of contactor 202 with pogo pins 201. Contactor 202 may be comprised of housing 208 and cross-hair window 212. Housing 208 may be an elongated, plastic part into which a variety of cavities are formed. Cavities 210 are pressfit holes into which alignment dowel pegs 203 are forced. Cavities 214 are countersunk through holes, each hole being adapted to receive one screw 207 that securely fix contactor 202 to interface board 204. Cavities 218 are counterbored through holes, each hole being adapted to receive one pogo pin 70 of fixed pin group 201. Cross-hair window 212 is used during the alignment of contactor 202 with dies 44 as discussed below.

Figure 12B:
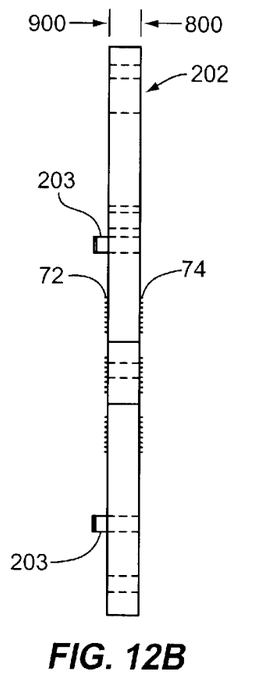
FIG. 12B is a side view of the contactor with pogo pins.
Figure 12C:
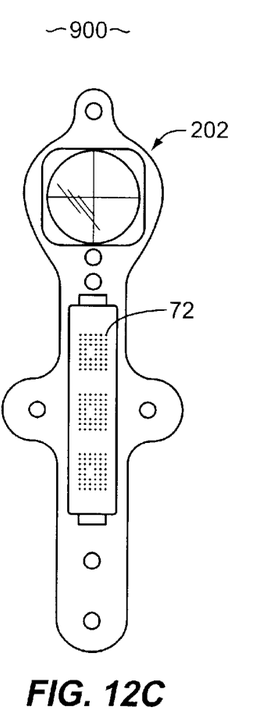
FIG. 12C illustrates the communication side of the contactor with pogo pins.
Figure 12D:
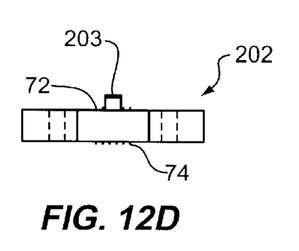
FIG. 12D is a rear view of the contactor with pogo pins.
Figure 12E:
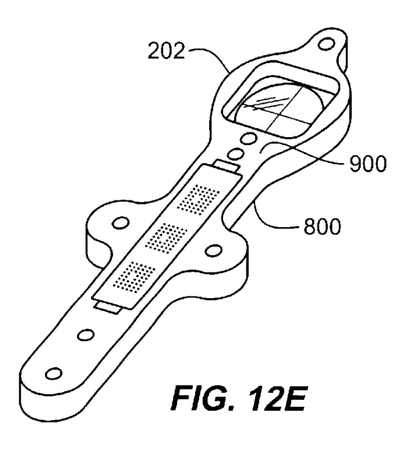
FIG. 12E is an isometric view of the contactor with pogo pins.

FIG. 12B is a side view of contactor 202. Note that only pins 74 of pogo pins 70 extend beyond the flat surface of contactor 202 on testing side 800. Dowel pins 203 extend above the communication side surface to permit engagement with interface board 204. FIG. 12C illustrates the communication side of the contactor with pogo pins, showing pins 72 of pogo pins 72 exposed and ready for contact with electric pads 205 of interface board 204 (FIG. 9). FIG. 12D is a rear view of contactor 202 with pogo pins 70, giving a perspective of the pins and pegs as they extend beyond the opposing surfaces of contactor 202. FIG. 12E shows contactor 202 in an isometric view.

Figure 13A:
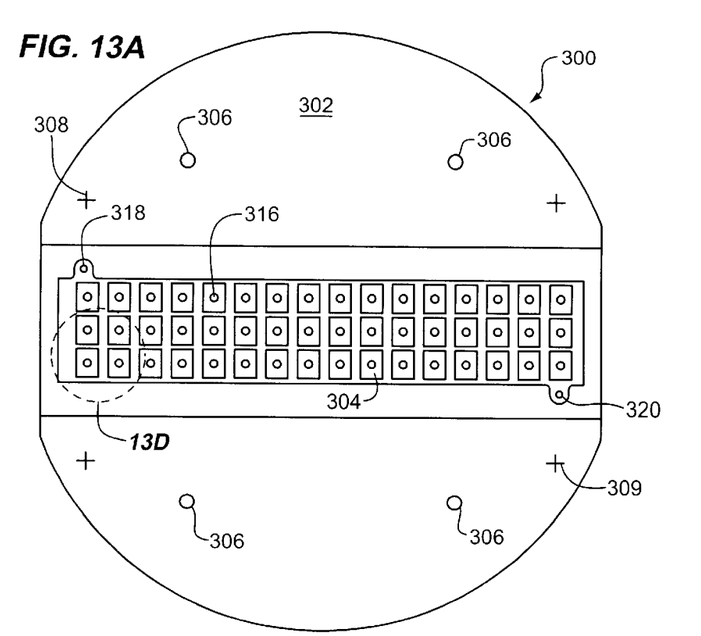
FIG. 13A is a plan view of the panel stage.
Figure 13B:
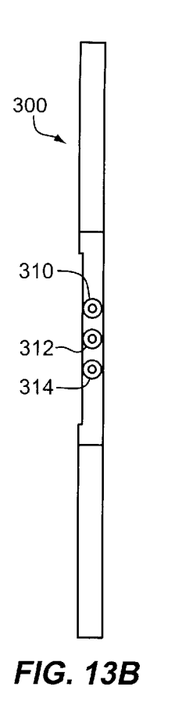
FIGS. 13B and 13C are side views of the panel stage.
Figure 13C:
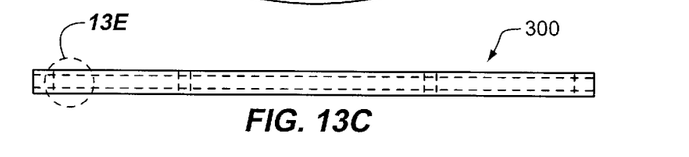

FIG. 13A is a plan view of panel stage 300. FIG. 13B and 13C are side views of panel stage 300. In general, panel stage 300 is used as a platform or stage on which to place reinforcing panel 48 for testing. Preferably, panel stage 300 is a machined aluminum or steel disk of approximately the size of a conventional wafer. The shape of panel stage 300 permits the use of a conventional wafer prober such as shown in FIG. 7 and FIG. 8.

Panel stage 300 comprises stage surface 302, die stages 304, counter bore holes 306, alignment cross-hairs 308 and 309 (fiducial marks), vacuum cavities 310, 312, and 314 forming a vacuum manifold, vacuum inlets 316, and panel pegs 318 and 320. Air leveler 122 of FIG. 7 is used to profile the pitch and roll of stage surface 302 in to a level surface using profiler stem 323. Dies 44 within reinforcing panel 48 of FIG. 5 lay flat against die stages 304. A vacuum is drawn from vacuum pump 322 of FIG. 8 through vacuum hoses 324 and coupled to vacuum cavities 310, 312, and 314 so as to place the vacuum directly below each die 44 through vacuum inlets 316.

Figure 13D:
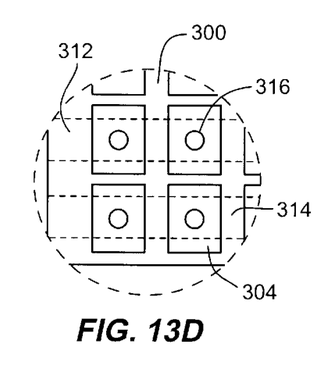
FIG. 13D is a detail view of the die stages showing the vacuum inlets.
Figure 13E:
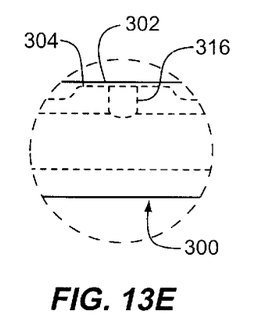
FIG. 13E is a detailed side view showing the elevation of the die stage.

FIG. 13D shows in detail vacuum inlets 316. Each vacuum inlet 316 is centered within each die stage 304 so as to evenly draw die 44 down towards die stage 304 and seat on top of die stage 304. To protect the edges of die 44, die stage 304 is raised above indented stage surface 302. This is shown in FIG. 13E. Importantly, the perimeter of a die stage 304 falls within the perimeter of a die 44. Restricting the surface of die stage 304 to within the perimeter of die 44 allows die 44 to overhang die stage 304. In this way, encapsulant 36 will not interfere with planarity of die 44 and the chances of die 44 cracking die to stress is reduced.

Figure 13F:
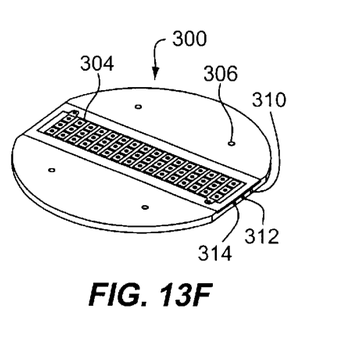
FIG. 13F is an isometric view of the panel stage.

Counter bore holes 306 are used in conjunction with screws 138 (FIG. 14) to hold panel stage 300 to chuck 134. Alignment cross-hairs 308 and 309 and panel pegs 318 and 320 are used for alignment as discussed below. FIG. 13F is an isometric view of the panel stage.

FIG. 14 is an exploded view of an assembly of an invention embodiment. Initially, chuck 134 resides within a conventional wafer prober system such as shown in FIG. 7. Panel stage 300 is mounted to chuck 134 and held secure by four screws 138. Vacuum cavities 310, 312, and 314 are plugged at the opposing end by inserting brass screw plugs with gaskets 350 into threaded holes 311. Vacuum hoses 324 are coupled to panel stage 300 by barb fittings 360 held in position to one another by barb yoke 362. Reinforcing panel 48 is lain upon panel stage 300 with circuit side 24 facing up. Alignment hole 35 is place about panel peg 320 and alignment hole 36 is placed about panel peg 318. This alignment permits each die 44 (FIG. 5) to be centrally disposed about each die stage 304 as shown in FIG. 14.

When vacuum pump 322 of FIG. 8 is engaged, reinforcing panel 48 is brought tight, direct, flat contact at each die 44 located on each die stage 304. This makes each die 44 relative in X, Y, Z position with respect to alignment cross-hairs 308 and 309 of panel stage 300 and relative in pitch and roll position with respect to surface stage 302 of panel stage 300. By profiling and aligning contactor 202 with respect to alignment cross-hairs 308 and 309 and surface stage 302, pin 74 (FIG. 12B) of each pogo pin 70 may be brought into electrical contact with each land pad 22 (FIG. 6).

Figure 15:
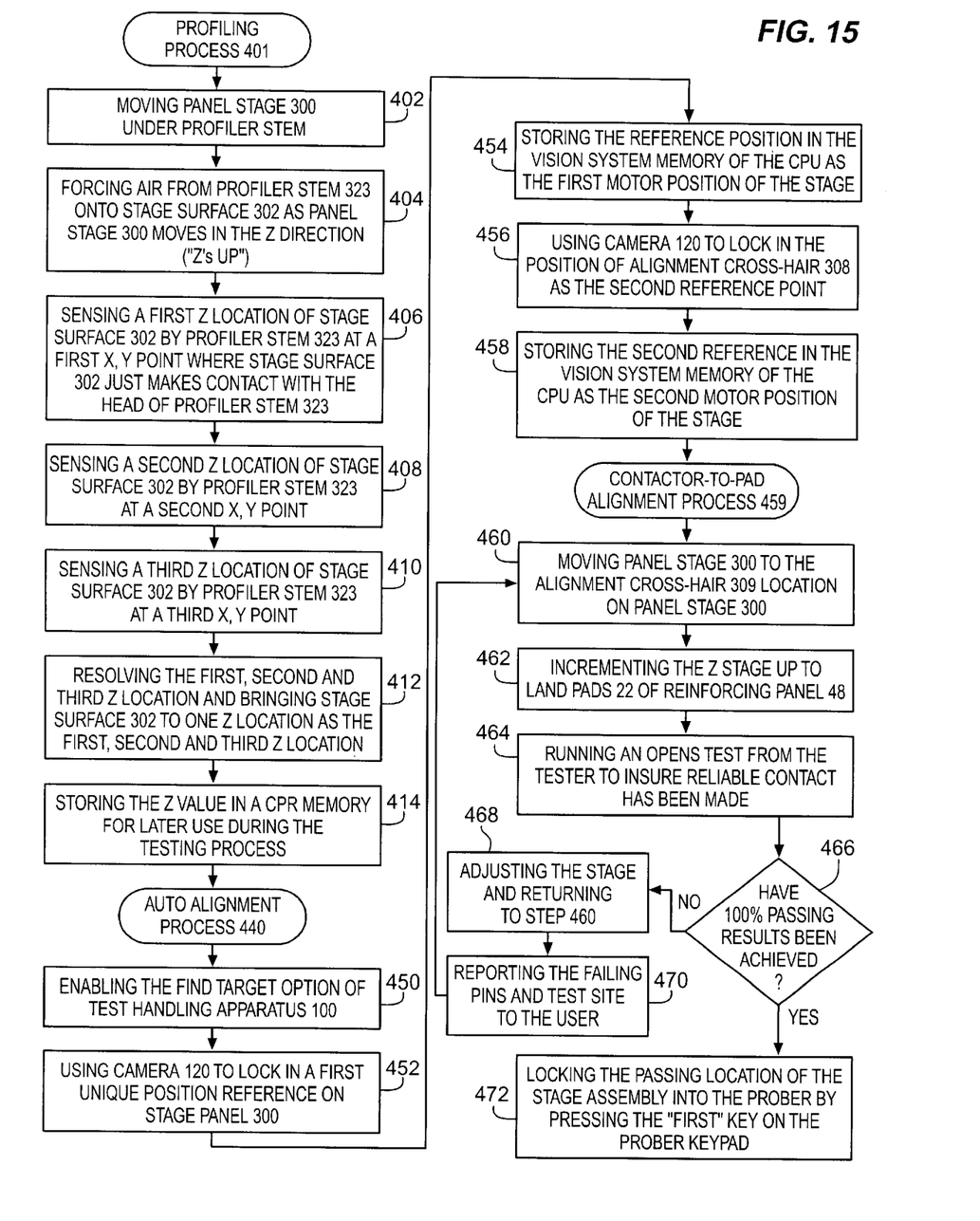
FIG. 15 is a flow chart that shows a process for testing dies within a reinforcing panel mounted in a test handling apparatus.

FIG. 15 is a flow chart that shows process 600 for testing dies 44 within a reinforcing panel 48 mounted within test handling apparatus 100. The pitch and roll position is first address through profiling, then the X, Y, and Z position are addressed through Auto Alignment. Last is contactor to panel contact pad alignment.

1) Profiling

This process involves forced air sense type topography measurement of panel stage 300. With reinforcing panel 48 located in panel stage 300 and vacuum pump 322 turned on, panel stage 300 is moved under profiler stem 323 of air leveler 122 as step 302. As step 304, profiler stem 323 forces air onto stage surface 302 as the panel stage 300 moves in the Z direction ("Z's up") to the head of profiler stem 323. At step 306, a first Z location of stage surface 302 is then sensed by profiler stem 323 at a first X, Y point where stage surface 302 just makes contact with the head of profiler stem 323. Preferably, this is indicated to profiler stem 323 through back pressure from the air impacting stage surface 302. At step 308, a second Z location of stage surface 302 is then sensed by profiler stem 323 at a second X, Y point. At step 310, a third Z location of stage surface 302 is then sensed by profiler stem 323 at a third X, Y point. At step 312, the first, second, and third Z location are resolved and stage surface 302 is brought to one Z location as the first, second, and third Z location.

A CPU of test handling apparatus 100 can then accurately understand where panel stage 300 is in relation to a Z motor position. At step 312, the CPU stores this Z value in memory for later use during the testing process. The purpose of this feature is to safeguard probe contacts, here pogo pins 70, by knowing the limitations of the Z up movement.

2) Auto Alignment

The process of auto alignment guarantees correct alignment of after switching out a first test reinforcing panel 48 with a second test reinforcing panel 48. As step 350, the find target option of test handling apparatus 100 is enabled. At step 352, camera 120 is used to lock in a first unique position on stage panel 300. Preferably, alignment cross-hair 309 is used. The shape of alignment cross-hair 309 offers the contrasting differences the optical vision system requires to successfully lock in an image. At step 354, this first reference is stored in the vision system memory of the CPU as is the first motor position of the stage. Note that feature 2 pt. 2 of the Model 2001X vision software is used. At step 356, camera 120 is used to lock in the position of alignment cross-hair 308 as the second reference point. At step 358, this second reference is stored in the vision system memory of the CPU as is the second motor position of the stage.

3) Contactor to Panel Contact Pad Alignment

This process is manual in nature but involves utilizing the alignment cross-hair 309 on panel stage 300 as a reference. At step 360, panel stage 300 is moved to the alignment cross-hair 309 location on panel stage 300. At step 362, the Z stage is incremented up to land pads 22 of reinforcing panel 48. At step 364, an opens test is run from the tester to insure reliable contact has been made. Step 366 asks whether 100% passing results have been achieved. If 100% passing results are not achieved, the failing pins and test site are reported to the user under step 368. The user then adjusts the stage at step 370 and returns to step 360. The test is repeated until passing results are achieved. If 100% passing results are achieved, the passing location of the stage assembly is then locked into the prober by pressing the "First" key on the prober keypad under step 372. This guarantees that the stage will always go back to the exact same location for testing.

By testing dies prior to singulation, the invention saves time and costs in singulating, marking, inspecting, and packaging devices that fail at the testing stage. The invention enables better testing throughput and eliminates the requirement to build unique, dedicated contactors and conversion kits for each die size. This style of contacting induces less package damage since alignment is achieved optically through fiducial marks rather than mechanically by contacting the sides of singulated devices and their associated solder balls.

While certain exemplary embodiments have been described and shown in the accompanying drawings, it is to be understood that such embodiments are merely illustrative of and not restrictive on the broad invention. For example, any number of dies—two, three, five, sixteen, etc.—may be simultaneously tested by the invention. The scope of each claim term is not limited to the specific constructions and arrangements shown and described, since various other modifications may occur to those ordinarily skilled in the art.

What is claimed is:

1. A test handling assembly comprising:
   a wafer prober system having a chuck;
   a panel stage coupled to the chuck;
   a contactor adapted to communicatively engage a conjoined integrated circuit dice coupled to the panel stage and the wafer prober system; and
   a profiler stem adapted to distribute air onto the panel stage as the panel stage moves towards the profiler stem in a Z direction and having a head to sense Z locations at a plurality of X, Y points.

2. The test handling assembly of claim 1, the wafer prober system having a tester and a vacuum pump.

3. The test handling assembly of claim 2 wherein the wafer prober system comprises an Automatic Wafer Prober System manufactured by Electroglas, Incorporated.

4. The test handling assembly of claim 1, the panel stage having
   a stage surface,
   a plurality of die stages arranged into rows and columns,
   at least one alignment cross-hair,
   one vacuum cavity for each row of die stages, and
   at least two panel pegs.

5. The test handing assembly of claim 4, each die having a perimeter, wherein each die of the conjoined integrated circuit dice is disposed against a die stage having a perimeter and wherein the perimeter of a die stage falls within the perimeter of a die.

6. The test handling assembly of claim 1 wherein the panel stage is a machined aluminum or steel disk, the disk having a diameter that is at least eight inches.

7. The test handling assembly of claim 1 wherein the conjoined integrated circuit dice are two or more dice maintained a distance apart.

8. The test handling assembly of claim 7 wherein the conjoined integrated circuit dice are maintained a predetermined distance apart by a semi-rigid spacer.

9. The test handling assembly of claim 8 wherein the semi-rigid spacer is an interposer tape coupled to a frame to form a reinforcing panel.

10. The test handling assembly of claim 1, the contactor having a plurality of pogo pins.

11. The test handling assembly of claim 10 wherein each pogo pin has a spring having a spring force of less than 40 grams.

12. The test handling assembly of claim 11 wherein the spring force of each pogo pin is 10 grams.

13. The test handling assembly of claim 12, the contactor further having a housing and a cross-hair window.

14. The test handling assembly of claim 1 wherein the contactor is coupled to a cabling ring through an interface board to form a probe card.

15. The test handling assembly of claim 14 wherein the interface board is a ten layer composite that is adapted to reconfigure a grid shaped input of the contactor into a ringed shaped output.

16. A test handling assembly comprising:
   a wafer prober system having a chuck, a tester, and a vacuum pump;
   a panel stage coupled to the chuck, the panel stage having a stage surface, a plurality of die stages arranged into rows and columns, at least one alignment cross-hair, one vacuum cavity for each row of die stages, and at least two panel pegs;
   a plurality of conjoined integrated circuit dice disposed adjacent to the panel stage;
   a contactor having a housing and a cross-hair window, the contactor communicatively coupled to the conjoined integrated circuit dice and the wafer prober system, the contactor having a plurality of pogo pins, wherein the contactor is coupled to a cabling ring through an interface board to form a probe card; and
   a profiler stem adapted to distribute air onto the panel stage as the panel stage moves towards the profiler stem in a Z direction and having a head to sense a Z location at a plurality of X, Y points.

17. A method for testing conjoined integrated circuit dice, comprising:

profiling a panel stage supporting the conjoined integrated circuit dice using an air sense type topography measurement; and aligning the conjoined integrated circuit dice to pins by adjusting the panel stage, wherein the pins are initially disposed apart from the conjoined integrated circuit dice.

18. The method of claim 17 wherein profiling a panel stage supporting the conjoined integrated circuit dice includes:

moving the panel stage under a profiler stem adapted to distribute air;

forcing air from the profiler stem onto a surface of the panel stage as the panel stage moves towards the profiler stem in a Z direction, the stage surface having a plurality of X, Y, Z points and the profiler stem having a head;

sensing a first Z location of the stage surface at a first X, Y point through the profiler stem just as the stage surface makes contact with the head of the profiler stem;

sensing a second Z location of the stage surface at a second X, Y point through the head of the profiler stem;

sensing a third Z location of the stage surface at a third X, Y point through the head of the profiler stem;

resolving the first, second, and third Z locations and bringing the stage surface to one Z location; and storing the Z value of the Z location in a CPU memory.

19. The method of claim 17 wherein aligning the conjoined integrated circuit dice to pins comprises:

enabling a find target option of a test handling apparatus coupled to the pins;

using a camera coupled to the test handling apparatus to lock in a first unique position reference on the panel stage;

storing the position reference in a vision system memory of the CPU as the first motor position of the stage;

using the camera to lock in the position of an alignment cross-hair on the panel stage as the second reference point; and storing the second reference in the vision system memory of the CPU as the second motor position of the stage.

20. The method of claim 19 further comprising:

moving the panel stage to the alignment cross-hair location on the panel stage;

incrementing land pads of the conjoined integrated circuit dice towards the pins;

running an opens test from a tester coupled to the pins to determine whether reliable contact has been made;

if 100% passing results have not been achieved, then reporting the failing pins and test site to a user, adjusting the panel stage, moving the panel stage to the alignment cross-hair location on the panel stage, incrementing land pads of the conjoined integrated circuit dice towards the pins, and running an opens test from a tester coupled to the pins to determine whether reliable contact has been made; and if 100% passing results have been achieved, then locking the passing location of the stage assembly into the prober by pressing a "First" key on a prober keypad coupled to the test handling apparatus.

21. The test handling assembly of claim 16, each die having a perimeter, wherein each die of the conjoined integrated circuit dice is disposed against a die stage having a perimeter and wherein the perimeter of a die stage falls within the perimeter of a die.

22. The test handling assembly of claim 16, wherein the conjoined integrated circuit dies are two or more dies maintained a distance apart by a semi-rigid spacer and wherein the semi-rigid spacer is an interposer tape coupled to a frame to form a reinforcing panel.

23. A machine-readable medium having stored thereon data representing sequences of instructions, the sequences of instructions which, when executed by a processor, cause the processor to:

profile a panel stage supporting the conjoined integrated circuit dice using an air sense type topography measurement; and align the conjoined integrated circuit dice to pins by adjusting the panel stage, wherein the pins are initially disposed apart from the conjoined integrated circuit dice.

24. The machine-readable medium of claim 23 wherein profiling a panel stage supporting the conjoined integrated circuit dice includes:

moving the panel stage under a profiler stem adapted to distribute air;

forcing air from the profiler stem onto a surface of the panel stage as the panel stage moves towards the profiler stem in a Z direction, the stage surface having a plurality of X, Y, Z points and the profiler stem having a head;

sensing a first Z location of the stage surface at a first X, Y point through the profiler stem just as the stage surface makes contact with the head of the profiler stem;

sensing a second Z location of the stage surface at a second X, Y point through the head of the profiler stem;

sensing a third Z location of the stage surface at a third X, Y point through the head of the profiler stem;

resolving the first, second, and third Z locations and bringing the stage surface to one Z location; and storing the Z value of the Z location in a CPU memory.

25. The machine-readable medium of claim 23 wherein aligning the conjoined integrated circuit dice to pins comprises:

enabling a find target option of a test handling apparatus coupled to the pins;

using a camera coupled to the test handling apparatus to lock in a first unique position reference on the panel stage;

storing the position reference in a vision system memory of the CPU as the first motor position of the stage;

using the camera to lock in the position of an alignment cross-hair on the panel stage as the second reference point; and storing the second reference in the vision system memory of the CPU as the second motor position of the stage.

26. The machine-readable medium of claim 25 further comprising:

moving the panel stage to the alignment cross-hair location on the panel stage;

incrementing land pads of the conjoined integrated circuit dice towards the pins;

running an opens test from a tester coupled to the pins to determine whether reliable contact has been made;

if 100% passing results have not been achieved, then reporting the failing pins and test site to a user, adjusting the panel stage,
moving the panel stage to the alignment cross-hair location on the panel stage,
incrementing land pads of the conjoined integrated circuit dice towards the pins, and
running an opens test from a tester coupled to the pins to determine whether reliable contact has been made; and if 100% passing results have been achieved, then
locking the passing location of the stage assembly into the prober by pressing a "First" key on a prober keypad coupled to the test handling apparatus.

27. A test handling assembly comprising:

a means for profiling a panel stage supporting a conjoined integrated circuit dice by distributing air onto the panel stage as the panel stage moves towards a profiler stem in a Z direction and sensing Z locations at a plurality of X, Y points; and a means for aligning the conjoined integrated circuit dice to pins by adjusting the panel stage, wherein the pins are initially disposed apart from the conjoined integrated circuit dice.

28. The test handling apparatus of claim 27 wherein said means for profiling a panel stage supporting a conjoined integrated circuit dice further:

moves the panel stage under a profiler stem adapted to distribute air;

forces air from the profiler stem onto a surface of the panel stage as the panel stage moves towards the profiler stem in a Z direction, the stage surface having a plurality of X, Y, Z points and the profiler stem having a head;

senses a first Z location of the stage surface at a first X, Y point through the profiler stem just as the stage surface makes contact with the head of the profiler stem;

senses a second Z location of the stage surface at a second X, Y point through the head of the profiler stem;

senses a third Z location of the stage surface at a third X, Y point through the head of the profiler stem;

resolves the first, second, and third Z locations and bringing the stage surface to one Z location; and stores the Z value of the Z location in a CPU memory.

29. The test handling apparatus of claim 27 wherein said means for aligning the conjoined integrated circuit dice to pins further:

enables a find target option of a test handling apparatus coupled to the pins;

uses a camera coupled to the test handling apparatus to lock in a first unique position reference on the panel stage;

stores the position reference in a vision system memory of the CPU as the first motor position of the stage;

uses the camera to lock in the position of an alignment cross-hair on the panel stage as the second reference point; and stores the second reference in the vision system memory of the CPU as the second motor position of the stage.

30. The test handling apparatus of claim 27 further comprising:

a means for moving the panel stage to the alignment cross-hair location on the panel stage;

a means for incrementing land pads of the conjoined integrated circuit dice towards the pins;

a means for running an opens test from a tester coupled to the pins to determine whether reliable contact has been made;

a means for determining whether 100% passing results have not been achieved, and reporting the failing pins and test site to a user, adjusting the panel stage, moving the panel stage to the alignment cross-hair location on the panel stage, incrementing land pads of the conjoined integrated circuit dice towards the pins, and running an opens test from a tester coupled to the pins to determine whether reliable contact has been made; and a means for determining whether 100% passing results have been achieved, then locking the passing location of the stage assembly into the prober by pressing a "First" key on a prober keypad coupled to the test handling apparatus.

* * * * *

UNITED STATES PATENT AND TRADEMARK OFFICE
CERTIFICATE OF CORRECTION

PATENT NO. : 6,373,268 B1
DATED : April 16, 2002
INVENTOR(S) : Dunlap et al.

It is certified that error appears in the above-identified patent and that said Letters Patent is hereby corrected as shown below:

Title page,
Item [75], delete "Stewart O. Dunlap;" and insert -- Stewart O. Dunlap, Carmichael; --.
Delete "both of".

Drawings,
After "FIG. 1" insert the legend -- PRIOR ART --.
After "FIG. 2A" insert the legend -- PRIOR ART --.
After "FIG. 2B" insert the legend -- PRIOR ART --.
After "FIG. 3" insert the legend -- PRIOR ART --.
After "FIG. 4A" insert the legend -- PRIOR ART --.
After "FIG. 4B" insert the legend -- PRIOR ART --.
After "FIG. 5" insert the legend -- PRIOR ART --.
After "FIG. 6" insert the legend -- PRIOR ART --.

Column 2,
Line 61, delete "FIG. 1 is" and insert -- FIG. 1 (PRIOR ART) is --.
Line 63, delete "FIG. 2 is" and insert -- FIG. 2 (PRIOR ART) is --.
Line 66, delete "FIG. 3 is" and insert -- FIG. 3 (PRIOR ART) is --.

Column 3,
Line 1, delete "FIG. 4 is" and insert -- FIG. 4 (PRIOR ART) is --.
Line 3, delete "FIG. 5 is" and insert -- FIG. 5 (PRIOR ART) is --.
Line 4, delete "FIG. 6 is" and insert -- FIG. 6 (PRIOR ART) is --.

Column 8,
Line 21, delete "claim 1" and insert -- claim 5 --.
Line 26, delete "maintained a distance apart" and insert -- maintained a predetermined distance apart according to pin group separation --.

Signed and Sealed this

Seventeenth Day of December, 2002

JAMES E. ROGAN
*Director of the United States Patent and Trademark Office*